US008058703B2

(12) United States Patent
Lee

(10) Patent No.: US 8,058,703 B2
(45) Date of Patent: Nov. 15, 2011

(54) SEMICONDUCTOR TRANSISTOR DEVICE AND METHOD OF MANUFACTURING THE SAME

(75) Inventor: Mueng-Ryul Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 586 days.

(21) Appl. No.: 12/070,096

(22) Filed: Feb. 14, 2008

(65) Prior Publication Data

US 2008/0191316 A1 Aug. 14, 2008

(30) Foreign Application Priority Data

Feb. 14, 2007 (KR) .................. 10-2007-0015390

(51) Int. Cl.
*H01L 29/39* (2006.01)
(52) U.S. Cl. ........ 257/592; 257/350; 257/378; 257/401; 257/57; 257/347; 257/370; 257/E29.202
(58) Field of Classification Search .......... 257/350, 257/378, 401, 57, 66, 347, 370, E29.202, 257/592
See application file for complete search history.

(56) References Cited

U.S. PATENT DOCUMENTS

| 5,132,753 | A | 7/1992 | Chang et al. ............. 357/23.4 |
| 6,117,738 | A * | 9/2000 | Tung ......................... 438/286 |
| 6,191,453 | B1 | 2/2001 | Petruzzello et al. ......... 257/350 |
| 6,258,674 | B1 * | 7/2001 | Kwon et al. ............... 438/286 |
| 2002/0125542 | A1 * | 9/2002 | Suzuki et al. ............. 257/500 |

* cited by examiner

*Primary Examiner* — Cuong Q Nguyen
*Assistant Examiner* — Tran Tran
(74) *Attorney, Agent, or Firm* — Monica H. Choi

(57) ABSTRACT

A semiconductor transistor device includes a drift region, an insulating structure, a gate insulator, a gate electrode, a source, and a drain. The drift region includes a first lateral portion having a first dopant concentration and a second lateral portion having a second dopant concentration that is higher than the first lateral portion. The insulating structure is formed on the drift region and is disposed over a border between the first and second lateral portions such that hole generation is minimized in the drift region during operation.

20 Claims, 9 Drawing Sheets

SEMICONDUCTOR TRANSISTOR DEVICE AND METHOD OF MANUFACTURING THE SAME

BACKGROUND OF THE INVENTION

This application claims priority under 35 USC §119 to Korean Patent Application No. 2007-15390, filed on Feb. 14, 2007 in the Korean Intellectual Property Office, the disclosure of which is incorporated herein in its entirety by reference.

Field of the Invention

The present invention relates generally to semiconductor transistor devices and a method of manufacturing the semiconductor transistor devices, and more particularly, to a lateral insulated gate bipolar transition (LIGBT) silicon on insulator (SOI) transistor device with a multiple doped drift region and a method of manufacturing the same.

Background of the Invention

FIG. 1 is a cross-sectional view of a conventional semiconductor transistor device 10. Referring to FIG. 1, the semiconductor transistor device 10 includes a first N-type impurity region 1, a second N-type impurity region 8, a third N-type impurity region 6, a first P-type impurity region 5, a second P-type impurity region 7, a third P-type impurity region 9, a field oxide structure 2, a gate insulator 3, and a gate electrode 4.

Each of the first, second, and third N-type impurity regions 1, 8 and 6, respectively, is doped with a respective N-type dopant. For example, the respective N-type dopant may be nitrogen (N), phosphorus (P), arsenic (As), antimony (Sb) or bismuth (Bi). In addition, each of the first, second, and third P-type impurity regions 5, 7, and 9, respectively, is doped with a respective P-type dopant. For example, the respective P-type dopant may be boron (B), aluminum (Al), gallium (Ga) or indium (In).

The field oxide structure 2 is formed at a surface of the first N-type impurity region 1. The gate insulator 3 is formed on an exposed portion of the first N-type impurity region 1 and the first P-type impurity region 5. The gate insulator 3 is formed to extend a predetermined distance from the field oxide structure 2. The gate insulator 3 may be comprised of silicon oxide. The gate electrode 4 is formed on the gate insulator 3 and the field oxide structure 2. The gate electrode 4 is comprised of a conductive material such as doped polysilicon for example.

The first P-type impurity region 5 is formed at an upper portion of the first N-type impurity region 1. The gate insulator 3 overlaps the first P-type impurity region 5 at the surface of a semiconductor material having the first P-type impurity region 5. The third N-type impurity region 6 and the second P-type impurity region 7 contact each other and are formed on a surface of the first P-type impurity region 5. In addition, the gate insulator 3 overlaps a portion of the third N-type impurity region 6.

Here, the third N-type impurity region 6 and the second P-type impurity region 7 are enclosed by the first P-type impurity region 5. Thus, the first N-type impurity region 1 and the third N-type impurity region 6 are horizontally separated by the first P-type impurity region 5.

The second N-type impurity region 8 is formed toward an upper portion of the first N-type impurity region 1 to extend from the field oxide structure 2 in a direction opposite from that of the third N-type impurity region 6. The third P-type impurity region 9 is formed on a surface of the second N-type impurity region 8. Particularly, the third P-type impurity region 9 is enclosed by the second N-type impurity region 8.

Here, the first N-type impurity region 1 has a first dopant concentration, and the second N-type impurity region 8 has a second dopant concentration substantially higher than the first dopant concentration. The third N-type impurity region 6 and the second P-type impurity region 7 form a source, and the third P-type impurity region 9 forms a drain, for the semiconductor transistor device 10 of FIG. 1.

FIG. 2 is a graph of a concentration of an N-type dopant under the gate insulator 3 and the field oxide structure 2 in the conventional semiconductor transistor device 10. Referring to FIG. 2, the concentration of the N-type dopant under the field oxide layer 2 in the first N-type impurity region 1 is substantially constant.

As illustrated in FIG. 3, Applicants performed a simulation that illustrates a region "A" in the cross-sectional view of FIG. 2 with a relatively large amount of holes generated therein when operating voltages are applied between the source and the drain and between the gate electrode 4 and the source of the semiconductor transistor device 10. The region A having a large amount of holes generated therein is disposed under the field oxide structure 2, and Applicants realize that the region A results from the concentration of the N-type dopant being substantially constant under the field oxide layer 2.

When operating voltages are applied between the source and the drain and between the gate electrode 4 and the source, a current flowing in a channel generated under the gate insulator 3 may flow under the field oxide structure 2. Here, electrons and holes are generated by collisions between such electrons and atoms. The holes generated by such collisions move to the second P-type impurity region 7 via the first P-type impurity region 5 such that the holes are removed from the second P-type impurity region 7.

The first P-type impurity region 5 has a resistance, and an additional current is generated when the relatively large amount of holes move to the second P-type impurity region 7. Such an amount of current is substantially proportional to the amount of such holes. The increased current from generation of the relatively large amount of holes may deteriorate the operating capacity of the semiconductor transistor device 10.

Particularly, the semiconductor transistor device 10 operates as a P—N—P bipolar junction transistor corresponding to the first P-type impurity region 5, the first and second N-type impurity regions 1 and 8, and the third P-type impurity region 9. However, when the additional current is generated, an N—P—N transistor formed by the third N-type impurity region 6, the first P-type impurity region 5, and the first N-type impurity region 1 may operate.

The operation of the N—P—N transistor may rapidly raise the current of the P—N—P transistor corresponding to the first P-type impurity region 5, the first and second N-type impurity regions 1 and 8, and the third P-type impurity region 9 such that a break-down voltage of the semiconductor transistor device 10 decreases. Thus, when a relatively large additional current is generated, the operating capacity of the semiconductor transistor device 10 is deteriorated.

SUMMARY OF THE INVENTION

Accordingly, a drift region with multiple doped portions is formed under an insulating structure for minimizing hole formation in a semiconductor transistor device.

Example embodiments of the present invention provide the above-mentioned semiconductor transistor device.

Example embodiments of the present invention provide a method of manufacturing the above-mentioned semiconductor device.

According to an aspect of the present invention, a semiconductor transistor device includes a drift region, an insulating structure, a gate insulator, a gate electrode, a source, and a drain. The drift region includes a first lateral portion having a first dopant concentration and a second lateral portion having a second dopant concentration that is higher than the first lateral portion. The insulating structure is formed on the drift region and is disposed over a border between the first and second lateral portions. The gate insulator is formed on an exposed portion of the first lateral portion. The gate electrode is formed on the gate insulator and a portion of the insulating structure. The source is disposed toward the first lateral portion of the drift region, and the drain is disposed toward the second lateral portion of the drift region. The drift region also includes an additional N-type drift portion formed in the second lateral portion toward the drain.

In an example embodiment of the present invention, the insulating structure is a field oxide structure centered about the border between the first and second lateral portions.

In a further embodiment of the present invention, the second dopant concentration is at least two times greater than the first dopant concentration. For example, the first and second dopant concentrations are each for a respective N-type dopant.

In another embodiment of the present invention, the semiconductor transistor device also includes a P-type silicon layer disposed below the first lateral portion, and includes a first P-type doped region disposed to a source side of the first lateral portion.

In a further embodiment of the present invention, the semiconductor transistor device further includes a second P-type doped region, an N-type doped source region, and a third P-type doped region. The second P-type doped region is disposed above the first P-type doped region and is disposed to the source side of the first lateral portion. The N-type doped source region is formed in the second P-type doped region to the source side of the gate electrode. The third P-type doped region is formed in the second P-type doped region and to the side of the N-type doped source region. The N-type doped source region and the third P-type doped region form a source of the semiconductor transistor device.

In another embodiment of the present invention, the gate insulator and the gate electrode extend to be disposed over the second P-type doped region and a portion of the N-type doped source region. Alternatively, the gate insulator and the gate electrode extend to be disposed over a portion of the second P-type doped region.

In a further embodiment of the present invention, the semiconductor transistor device also includes a first N-type doped region disposed below the second lateral portion of the drift region. A respective dopant concentration of the first N-type doped region is less than the second dopant concentration of the second lateral portion.

In addition, the semiconductor transistor device further includes a P-type doped drain region formed in the additional N-type drift portion. The P-type doped drain region forms the drain of the semiconductor transistor device. The additional N-type drift portion has a respective N-type dopant concentration that is greater than the second dopant concentration of the second lateral portion. For example, the respective N-type dopant concentration of the additional N-type drift portion increases from adjacent the second lateral portion to adjacent the P-type doped drain region.

In another embodiment of the present invention, the semiconductor transistor device further includes an insulating layer disposed below the P-type silicon layer such that the semiconductor transistor device is an SOI (silicon on insulator) device. Also, the insulating layer is disposed on a semiconductor substrate. Thus, the semiconductor transistor device is a Lateral Insulated Gate Bipolar Transition (LIGBT) Silicon On Insulator (SOI) device in an embodiment of the present invention.

According to another aspect of the present invention, there is provided a method of manufacturing a semiconductor transistor device. In the method of manufacturing a semiconductor device, a drift region is formed in a substrate. The drift region includes a first lateral portion having a first dopant concentration and a second lateral portion having a second dopant concentration that is higher than the first lateral portion. An insulating structure is formed on the drift region. The insulating structure is disposed over a border between the first and second lateral portions. An additional drift portion of the drift region is formed. The additional drift portion has a third dopant concentration that is higher than the second lateral portion. The additional drift portion is laterally separated from the first lateral portion by the second lateral portion. A gate insulator is formed on an exposed portion of the first lateral portion. A gate electrode is formed on the gate insulator and a portion of the insulating structure. A source is formed to be disposed toward the first lateral portion of the drift region. A drain is formed to be disposed toward the second lateral portion of the drift region, the drain being disposed in the additional drift portion.

According to still another aspect of the present invention, there is provided a method of manufacturing a semiconductor transistor device. In the method of manufacturing a semiconductor device, a first N-type doped region is formed at a silicon layer such that the first N-type doped region extends from a surface of the silicon layer to a predetermined depth. The first N-type doped region has a first N-type dopant concentration. A first P-type doped region is formed inside the silicon layer. The first P-type doped region is laterally separated from the first N-type doped region. An N-type dopant is doped into the entire surface of the silicon layer to form a drift region including a first lateral portion having a second N-type dopant concentration and a second lateral portion having a third N-type dopant concentration that is higher than the first lateral portion. The first lateral portion is formed at a portion of the silicon layer where the first P-type doped region is not formed such that the first lateral portion makes contact with the first P-type doped region. The second lateral region is formed at an upper portion of the first N-type doped region. A field oxide structure is formed at a portion of the surface of the silicon layer where the first lateral portion and the second lateral portion make contact with each other. An additional N-type drift portion is formed at a portion of the second lateral portion not being covered with the field oxide structure. The additional N-type drift portion has a fourth N-type dopant concentration substantially larger than the third N-type dopant concentration. A gate structure including a gate insulator and a gate electrode is formed. The gate insulator is formed on the first lateral portion such that the gate insulator extends from the field oxide structure to a predetermined length. The gate electrode is formed on the gate insulator and a portion of the field oxide structure. A second P-type doped region is formed at a portion of the first lateral portion not being covered with the gate structure such that the second P-type doped region makes contact with the first P-type doped region. An N-type doped source region is formed at a portion of the exposed surface of the second P-type doped region which makes contact with the gate structure. A third P-type doped region and a P-type doped drain region are formed. The third P-type doped region is formed at a portion of the exposed surface of the second P-type doped region which makes contact with the N-type source region. The P-type doped drain region is formed at the exposed surface of the additional N-type drift portion.

In this manner, with the differently doped first and second lateral portions of the drift region, holes are minimized in the drift region under the insulating structure. Thus, parasitic current from hole formation is minimized such that the operating capacity of the semiconductor transistor device is not deteriorated.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13 and 14 refer to elements having similar structure and/or function.

DETAILED DESCRIPTION OF THE INVENTION

Figure 1:
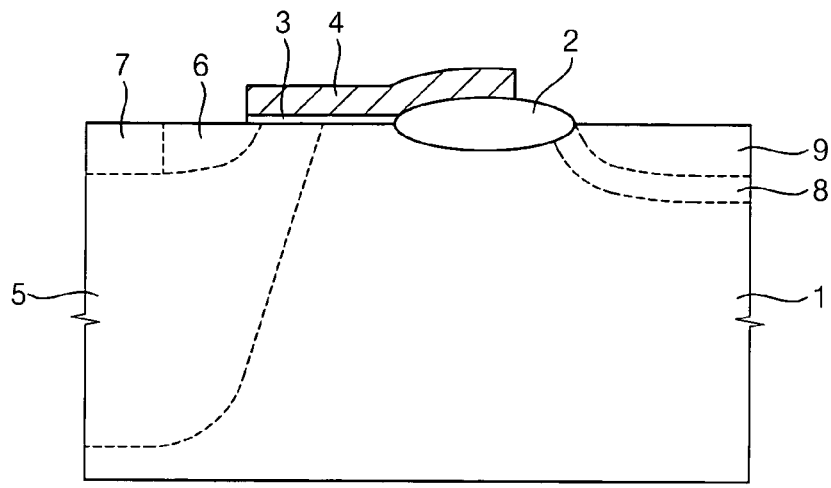
FIG. 1 is a cross-sectional view of a conventional semiconductor transistor device.
Figure 2:
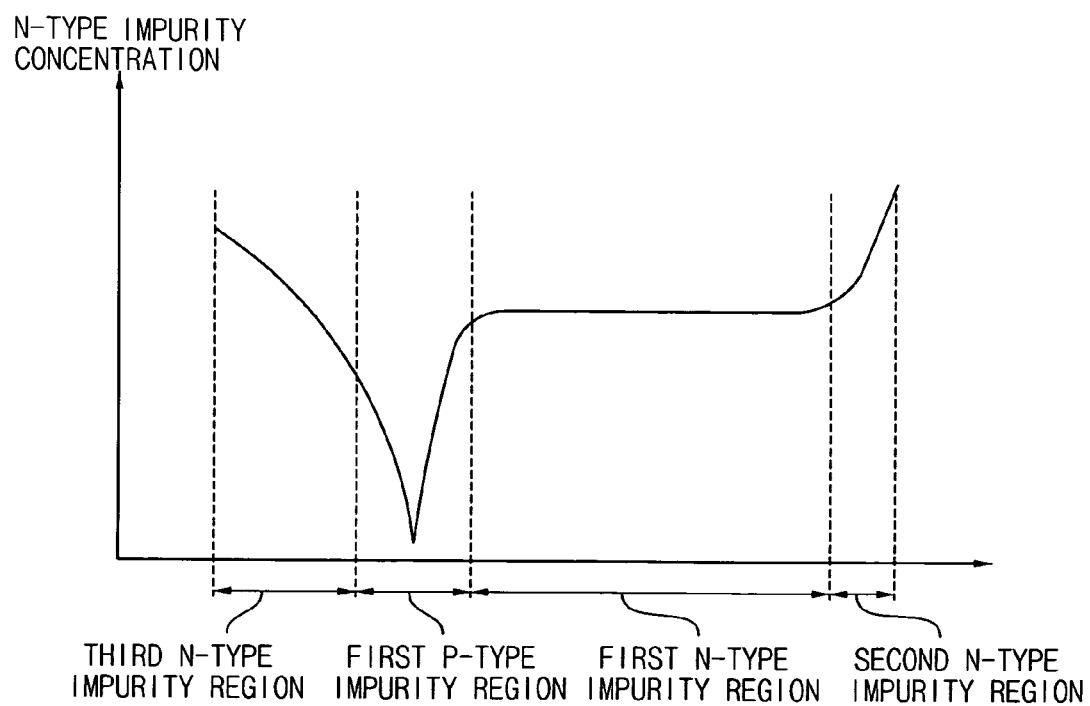
FIG. 2 is a graph of a concentration of an N-type dopant measured under a gate insulator and a field oxide structure included in the conventional semiconductor transistor device of FIG. 1.

The present invention is now described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "includes" and "including" specify the presence of stated features, integers, steps, operations, elements, and/or components, but do not preclude the presence and/or addition of one or more other features, integers, steps, operations, elements, components, and/or groups thereof.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include a fourth member, whereas the expression "at least one selected from the group consisting of A, B, and C" does not.

As used herein, the expression "or" is not an "exclusive or" unless it is used in conjunction with the phrase "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Figure 4:
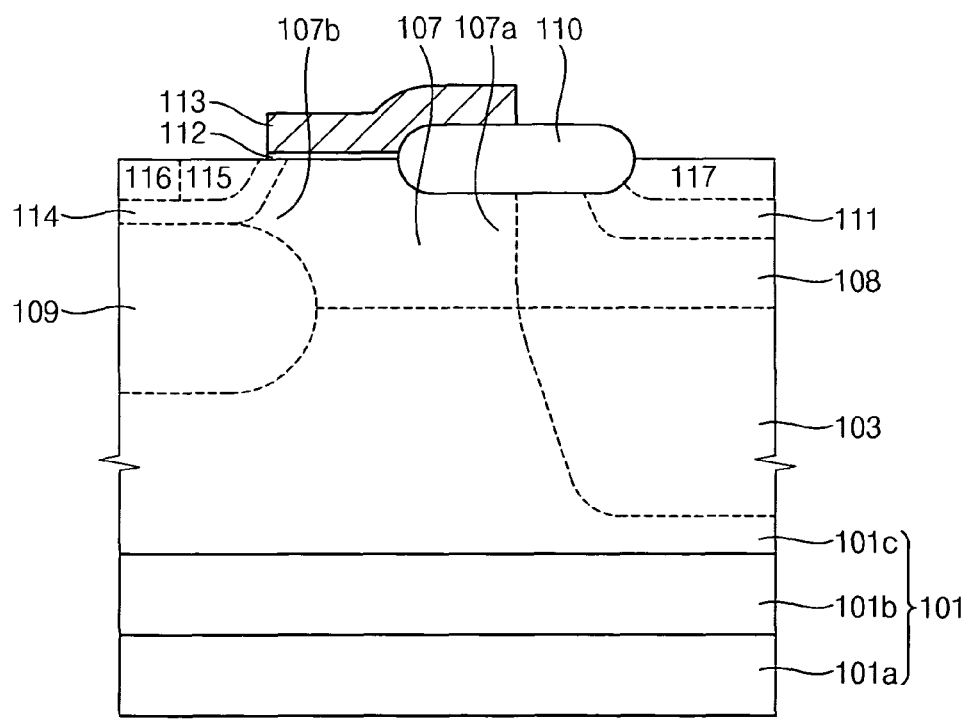
FIG. 4 is a cross-sectional view of a semiconductor transistor device, according to an embodiment of the present invention.

FIG. 4 is a cross-sectional view of a semiconductor transistor device 100 according to an embodiment of the present invention. Referring to FIG. 4, the semiconductor transistor device 100 includes a drift region comprised of a first lateral portion 107 and a second lateral portion 108 that are both doped with an N-type dopant.

The semiconductor transistor device 100 is formed on a silicon-on-insulator (SOI) substrate 101 including a silicon layer 101c that is doped P-type formed on a silicon oxide layer 101b. The silicon oxide layer 101b is formed on a semiconductor substrate such as a silicon substrate 101a that is doped P-type. The silicon layer 101c abuts the first lateral portion 107 below the first lateral portion 107.

Furthermore, the semiconductor transistor device 100 also includes a first P-type doped region 109 disposed to a source side 107b (i.e., toward the left side in FIG. 4) of the first lateral portion 107. Here, a respective bottom border of the first P-type doped region 109 is substantially lower than a respective bottom border of the first lateral portion 107. In addition, a respective upper border of the first P-type doped region 109 is substantially higher than the respective bottom border of the first lateral portion 107.

The semiconductor transistor device 100 further includes a second P-type doped region 114 disposed above the first P-type doped region 109 and disposed to the source side of the first lateral portion 107. Also, the semiconductor transistor device 100 also includes an N-type doped source region 115 formed in the second P-type doped region 114.

The semiconductor transistor device 100 further includes a third P-type doped region 116 formed in the second P-type doped region 114 and to the side of the N-type doped source region 115. The third P-type doped region 116 contacts the N-type doped source region 115. The third P-type doped region 116 and the N-type doped source region 115 are enclosed by the second P-type doped region 114.

The N-type doped source region 115 and the first lateral portion 107 are laterally separated from each other by the second P-type doped region 114. The N-type doped source region 115 and the first P-type doped region 109 are vertically separated from each other by the second P-type doped region 114. The third P-type doped region 116 and the first P-type doped region 109 are vertically separated from each other by the second P-type doped region 114.

The semiconductor transistor device 100 also includes a first N-type doped region 103 disposed below the second lateral portion 108 of the drift region. The first N-type doped region 103 makes contact with the second lateral portion 108 of the drift region. Additionally, an additional N-type drift portion 111 is formed to be enclosed by the second lateral portion 108 and extends from an insulating structure 110.

Furthermore, a P-type doped drain region 117 is formed to be enclosed by the additional N-type drift portion 111 at a surface of the additional N-type drift portion 111. The first N-type doped region 103 and the additional N-type drift portion 111 are separated from each other by the second lateral portion 108.

In addition, the semiconductor transistor device 100 further includes the insulating structure 110 formed on the drift region. The insulating structure 110 is a field oxide structure of silicon oxide for example formed to abut a border 107a between the first and second lateral portions 107 and 108 of the drift region. For example, the field oxide structure 110 is formed to be centered about the border between the first and second lateral portions 107 and 108.

Furthermore, the semiconductor transistor device 100 also includes a gate insulator 112 which may be comprised of silicon oxide formed on an exposed portion of the first lateral portion 107. Such an exposed portion extends from the insulating structure 110 to the source side 107b of the first lateral portion 107. In addition, in the example of FIG. 4, the gate insulator 112 is also formed on a portion of the second P-type doped region 114. A gate electrode 113 comprised of a conductive material such as doped polysilicon for example is also formed on the gate insulator 112 and on a portion of the insulating structure 110.

Figure 14:
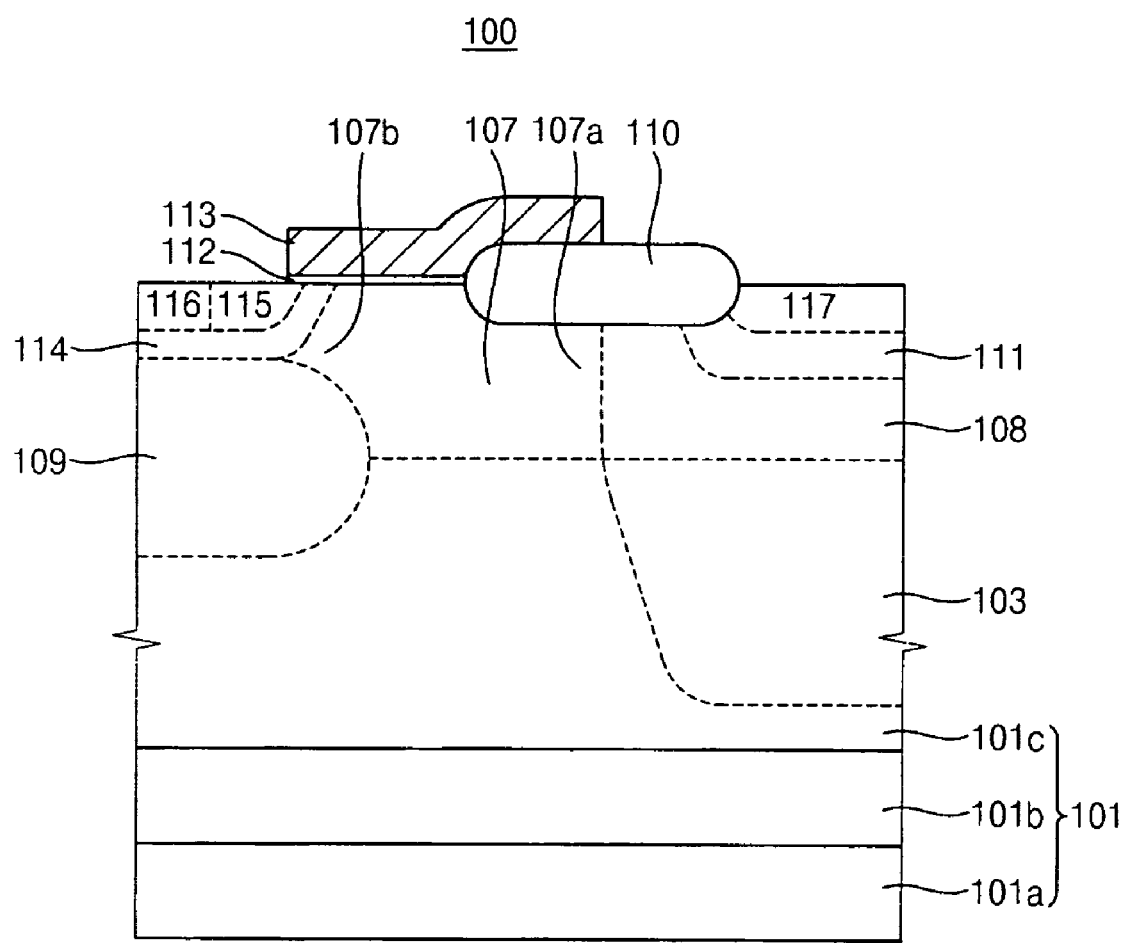
FIG. 14 is a cross-sectional view of a semiconductor transistor device, according to an alternative embodiment of the present invention.

In an alternative embodiment of the present invention, the gate insulator 112 and the gate electrode 113 may be formed to extend further. In that case, the gate insulator 112 and the gate electrode 113 would be formed to extend over a portion of the N-type doped source region 115 (as illustrated in FIG. 14 for example).

With such a structure of FIG. 4, the semiconductor transistor device 100 is a Lateral Insulated Gate Bipolar Transition (LIGBT) Silicon On Insulator (SOI) device in an embodiment of the present invention. The N-type doped source region 115 and the third P-type doped region 116 form a source of the semiconductor transistor device 100. The P-type doped drain region 117 forms a drain of the semiconductor transistor device 100. The gate electrode 113 forms a gate of the semiconductor transistor device 100.

In an embodiment of the present invention, the first lateral portion 107 has a first dopant concentration, and the second lateral portion 108 has a second dopant concentration that is significantly higher than the first dopant concentration. For example, the second dopant concentration of the second lateral portion 108 is at least two times higher than the first dopant concentration of the first lateral portion 107.

In addition, the first N-type doped region 103 has a respective N-type dopant concentration that is also significantly less than the second dopant concentration of the second lateral portion 108. For example, the second dopant concentration of the second lateral portion 108 is at least two times higher than the respective N-type dopant concentration of the first N-type doped region 103.

Furthermore, the additional N-type drift portion 111 has a respective N-type dopant concentration that is significantly higher than the second dopant concentration of the second lateral portion 108. For example, the respective N-type dopant concentration of the additional N-type drift portion 111 is at least two times higher than the second dopant concentration of the second lateral portion 108.

The respective N-type dopant for each of the regions 103, 107, 108, 111, and 115 may be nitrogen (N), phosphorus (P), arsenic (As), antimony (Sb) or bismuth (Bi), in an example embodiment of the present invention. The respective P-type dopant for each of the regions 101a, 101c, 109, 114, 116, and 117 may be boron (B), aluminum (Al), gallium (Ga) or indium (In), in an embodiment of the present invention.

The P-type regions 109, 114, 116, and 117 are formed by doping of a P-type dopant into the silicon layer 101c. The N-type regions 103, 107, 108, 115, and 117 are formed by doping of an N-type dopant into the silicon layer 101c. The first and second lateral portions 107 and 108 extend from the surface of the silicon layer 101c to substantially a same depth.

The first and second lateral portions 107 and 108 and the additional N-type drift portion 111 form a drift region where a channel of the semiconductor transistor device 100 is formed. The N-type dopant concentration is increased from the first lateral portion 107 and through the second lateral portion 108 and through the additional N-type drift portion 111 to the border of the P-type doped drain region 117.

FIGS. 5, 6, 7, 8, 9, 10, and 11 are cross-sectional views illustrating steps during fabrication of the semiconductor transistor device 100 of FIG. 4, according to an embodiment of the present invention.

Figure 5:
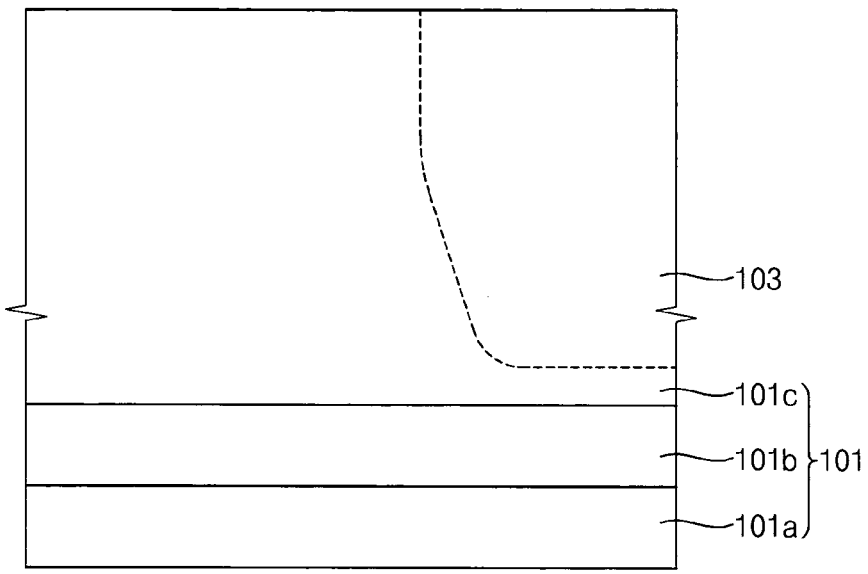
FIGS. 5, 6, 7, 8, 9, 10, and 11 are cross-sectional views illustrating steps during a method of fabricating the semiconductor transistor device of FIG. 4, according to an embodiment of the present invention.

Referring to FIG. 5, a silicon-on-insulator (SOI) substrate 101 includes a semiconductor substrate 101a such as a silicon substrate, an insulating layer 101b such as a silicon oxide layer, and a semiconductor layer 101c such as a silicon layer, that are successively stacked. Here, the silicon substrate 101a and the silicon layer 101c each may be already doped with a P-type dopant such as a respective one of boron (B), aluminum (Al), gallium (Ga), or indium (In), for example.

Further referring to FIG. 5, a portion of the silicon layer 101c is doped with an N-type dopant to form the first N-type doped region 103 with a respective N-type dopant concentration. Such an N-type dopant may be nitrogen (N), phosphorus (P), arsenic (As), antimony (Sb), or bismuth (Bi), for example. Here, the first N-type doped region 103 extends from a surface of the silicon layer 103a to a predetermined depth.

Figure 6:
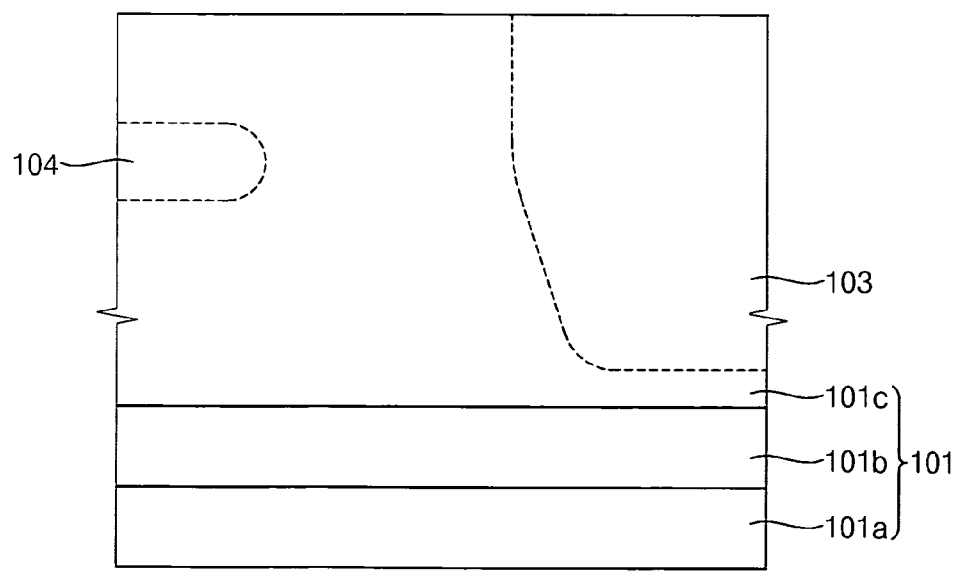

Referring to FIGS. 5 and 6, a P-type dopant is implanted to another portion of the silicon layer 101c using relatively high implantation to form a preliminary first P-type doped region 104 below the surface of the silicon layer 101c. Here, the preliminary first P-type doped region 104 is laterally separated from the first N-type doped region 103.

Figure 7:
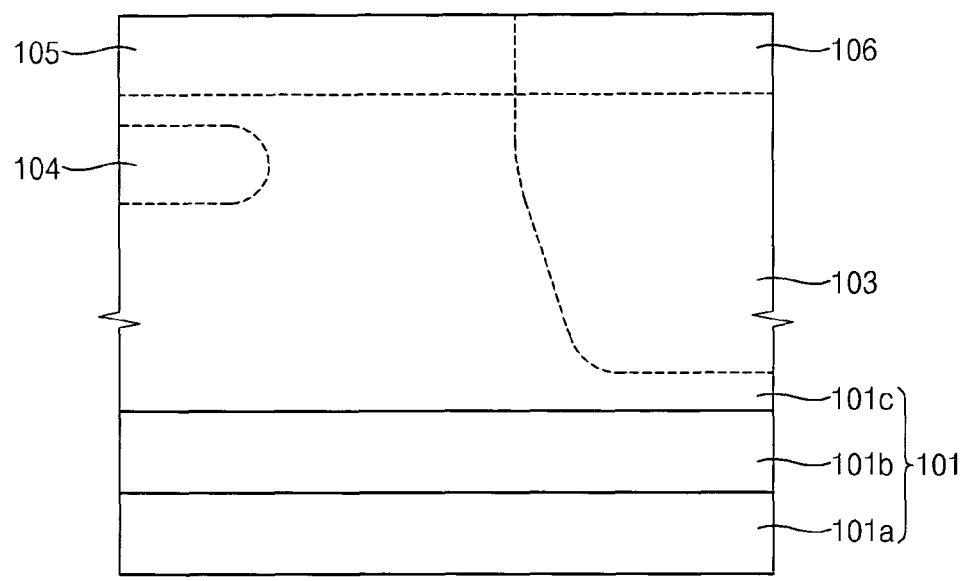

Referring to FIGS. 6 and 7, an N-type dopant is implanted into the surface of the silicon layer 101c. Thus, a preliminary first lateral portion 105 is formed at a surface portion of the silicon layer 101c where the first N-type doped region 103 is not formed. In addition, a preliminary second lateral portion 106 is formed at a surface portion of the silicon layer 101c where the first N-type doped region 103 was formed.

Figure 8:
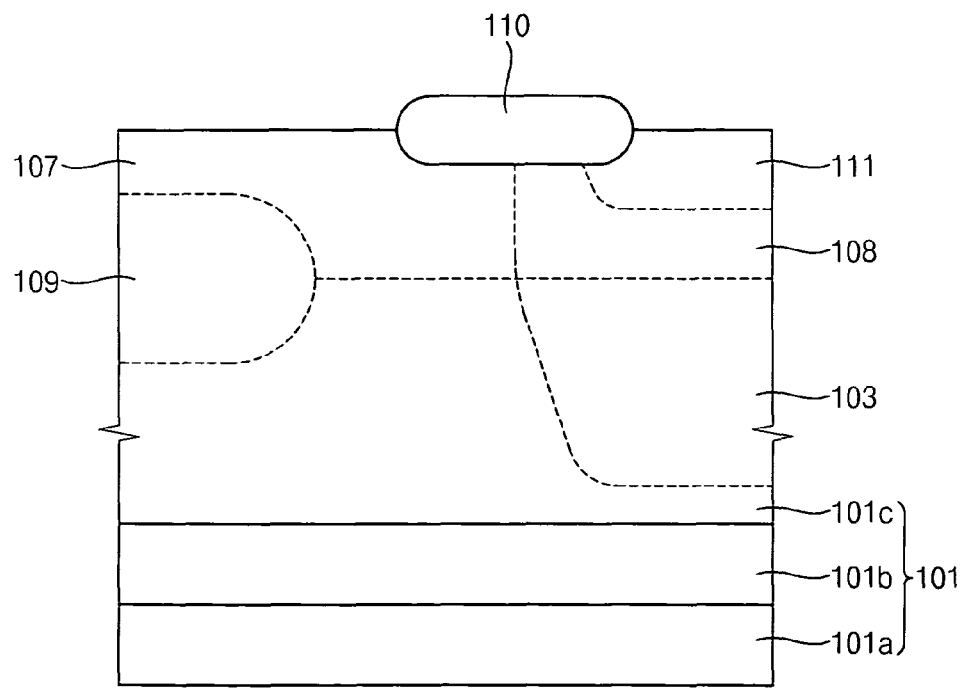

Referring to FIGS. 7 and 8, a thermal heating process is performed for the silicon substrate 101c. Thus, the preliminary first and second lateral portions 105 and 106 are transformed from thermal diffusion of the N-type dopants into the first and second lateral portions 107 and 108, respectively, of the drift region.

Because the preliminary first and second lateral portions 105 and 106 are formed with a same implantation process and thermal heating process, the first and second lateral portions 107 and 108 have a substantially same depth from the surface of the silicon layer 101c. In addition, because of thermal diffusion, the first and second lateral portions 107 and 108 have a lower depth from the surface of the silicon layer 101c than the preliminary first and second lateral portions 105 and 106.

Further referring to FIGS. 7 and 8, the preliminary first P-type doped region 104 is transformed by thermal diffusion into the first P-type doped region 109. Thus, the volume of the first P-type doped region 109 is substantially expanded from the preliminary first P-type doped region 104. In the embodiment of FIG. 8, the first lateral portion 107 and the first P-type doped region 109 contact each other.

The first lateral portion 107 has the first dopant concentration, and the second lateral portion 108 has the second dopant concentration. In an example embodiment of the present invention, the second dopant concentration of the second lateral portion 108 is substantially higher (such as at least twice as much) than the first dopant concentration of the first lateral portion 107 because the second lateral portion 108 is formed from implantation of an additional N-type dopant into an already N-type doped region 103. Furthermore, the second dopant concentration of the second lateral portion 108 is substantially higher (such as at least twice as much) than the respective N-type dopant concentration of the first N-type doped region 103.

Further referring to FIG. 8, the insulating structure 110 such as a field oxide structure is formed at a portion of the surface of the silicon layer 101c where the first and second lateral portions 107 and 108 abut each other. For example, the field oxide structure 110 is centered about the border between the first and second lateral portions 107 and 108. The field oxide structure 110 is formed by a thermal oxidation process in an example embodiment of the present invention.

Further referring to FIG. 8 after the field oxide structure 110 is formed, an N-type dopant is further implanted into an exposed portion of the second lateral portion 108 for forming the additional N-type drift portion 111. Thus, the additional N-type drift portion 111 has a respective N-type dopant concentration that is significantly higher (such as at least twice as much) than the second dopant concentration of the second lateral portion 108.

The additional N-type drift portion 111 is formed at an upper portion of the second lateral portion 108 and is enclosed by the second lateral portion 108. Furthermore, the additional N-type drift portion 111 is laterally separated from the first lateral portion 107 by the second lateral portion 108.

Here, the first and second lateral portions 107 and 108 and the additional N-type drift portion 111 form the drift region where a channel is formed for the semiconductor transistor device 100. In addition, the respective N-type dopant concentration increases by at least two at each transition of from the first lateral portion 107 to the second lateral portion 108 and from the second lateral portion 108 to the additional N-type drift portion 111.

Figure 9:
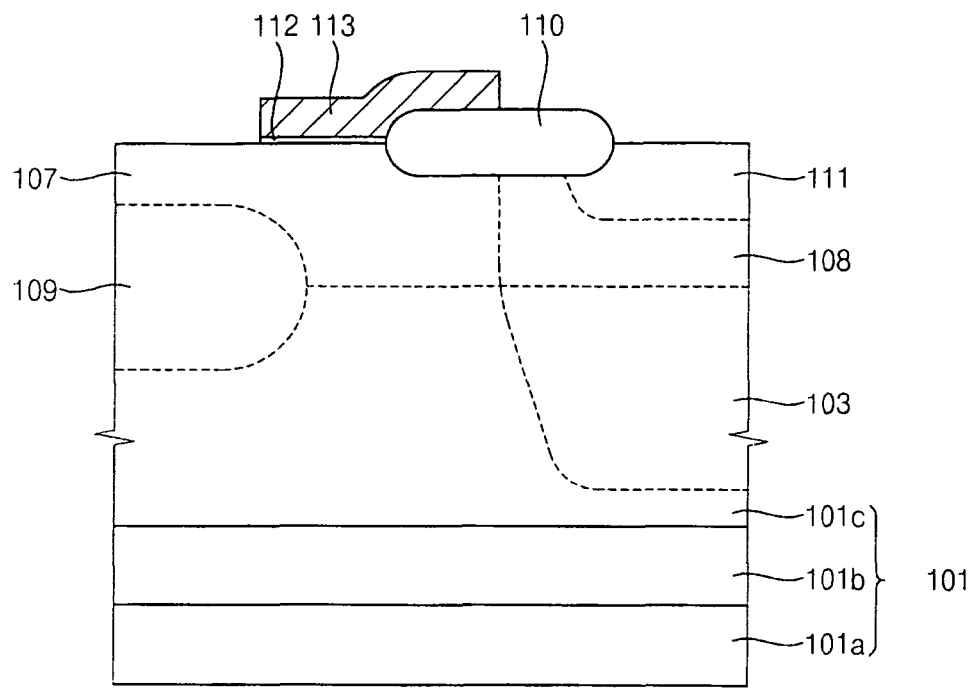

Referring to FIGS. 8 and 9, a gate insulating layer (not shown) is formed on exposed portions of the first lateral portion 107 and the additional N-type drift portion 111. For example, the gate insulating layer is formed by a thermal oxidation process. A gate electrode layer is then blanket deposited on the gate insulating layer and the insulating structure 110. The gate electrode is comprised of a conductive material such as doped polysilicon in an embodiment of the present invention.

Thereafter, the gate electrode layer and the gate insulating layer are patterned to form the gate insulator 112 and the gate electrode 113 as illustrated in FIG. 9. Referring to FIG. 9, the gate insulator 112 extends from the insulating structure 110 to a predetermined distance on the first lateral portion 107. The gate electrode 113 is disposed on the gate insulator 112 and a portion of the insulating structure 110.

Figure 10:
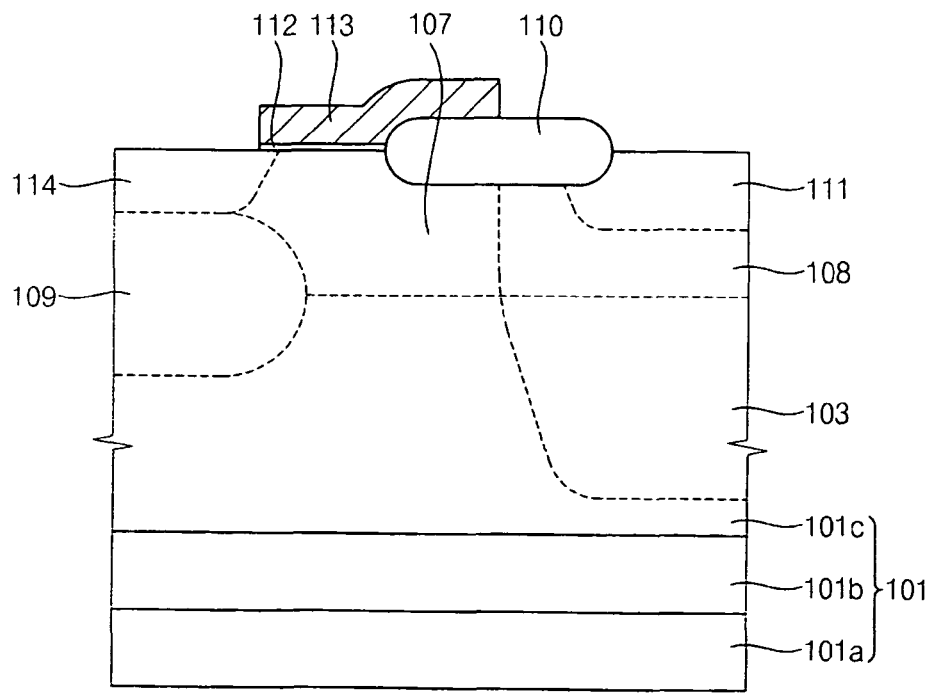

Referring to FIGS. 9 and 10, a P-type dopant is implanted into the exposed portion of the second lateral portion 107 to form the second P-type doped region 114. Subsequently, the second P-type doped region 114 is expanded by a subsequent thermal heating process to abut the first P-type doped region 109. In addition, the second P-type doped region 114 is expanded to extend under the gate insulator 112 in such a thermal heating process.

Figure 11:
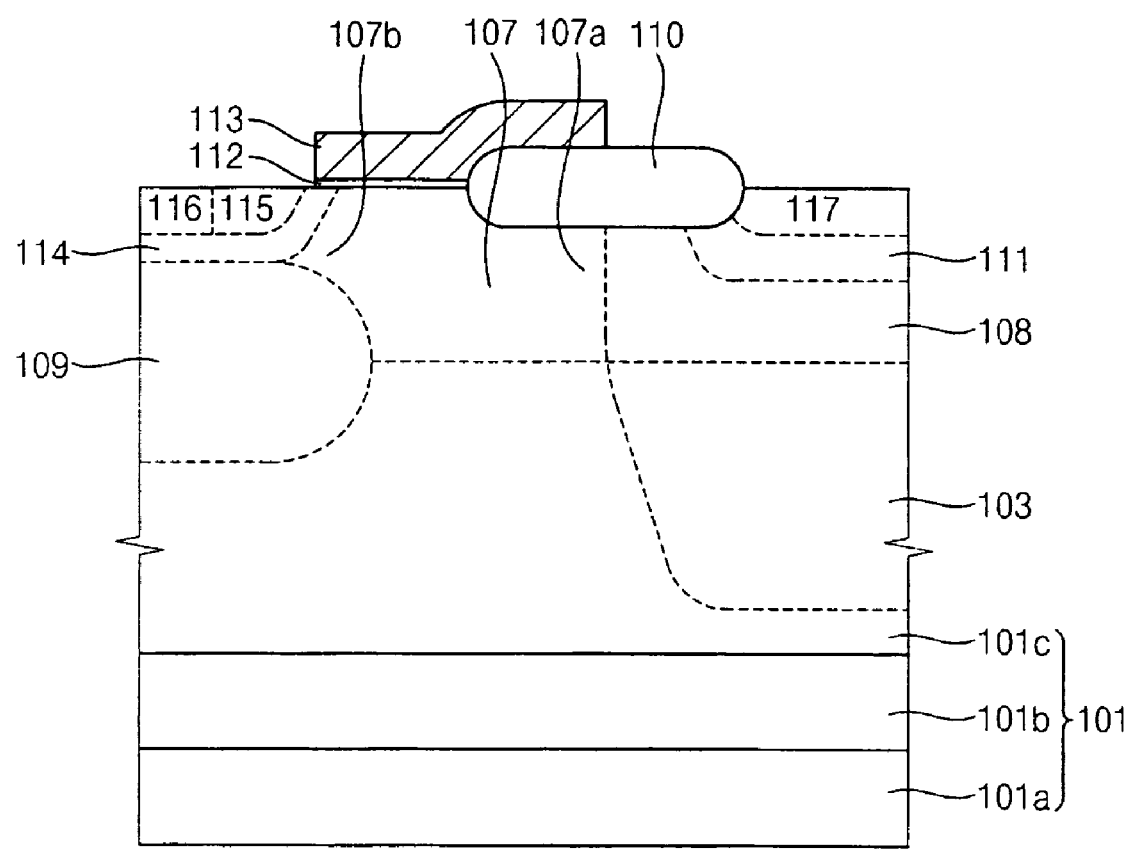

Referring to FIG. 11, an N-type dopant is implanted into a portion of the second P-type doped region 114 adjacent to the gate insulator 112 to form the N-type doped source region 115. In an alternative embodiment of the present invention, if any subsequent thermal heating process is performed, the N-type doped source region 115 extends under the gate insulator 112 (as illustrated in FIG. 14 for example). In the embodiment of FIG. 11, the N-type doped source region 115 and the first lateral portion 107 are laterally separated from each other by the second P-type doped region 114.

Further referring to FIG. 11, a P-type dopant is thereafter implanted into a portion of the second P-type doped region 114 next to the N-type doped source region 115 to form the third P-type doped region 116 that contacts the N-type doped source region 115. In addition, such implantation of the P-type dopant into the additional N-type drift portion 111 forms the P-type doped drain region 117. The regions 115, 116, and 117 are formed at the surface of the silicon layer 101c.

FIG. 11 shows the structures of the semiconductor transistor device 100 of FIG. 4. The third P-type doped region 116 and the N-type doped source region 115 form the source of the semiconductor transistor device 100. The P-type doped drain region 117 forms the drain of the semiconductor transistor device 100.

Figure 12:
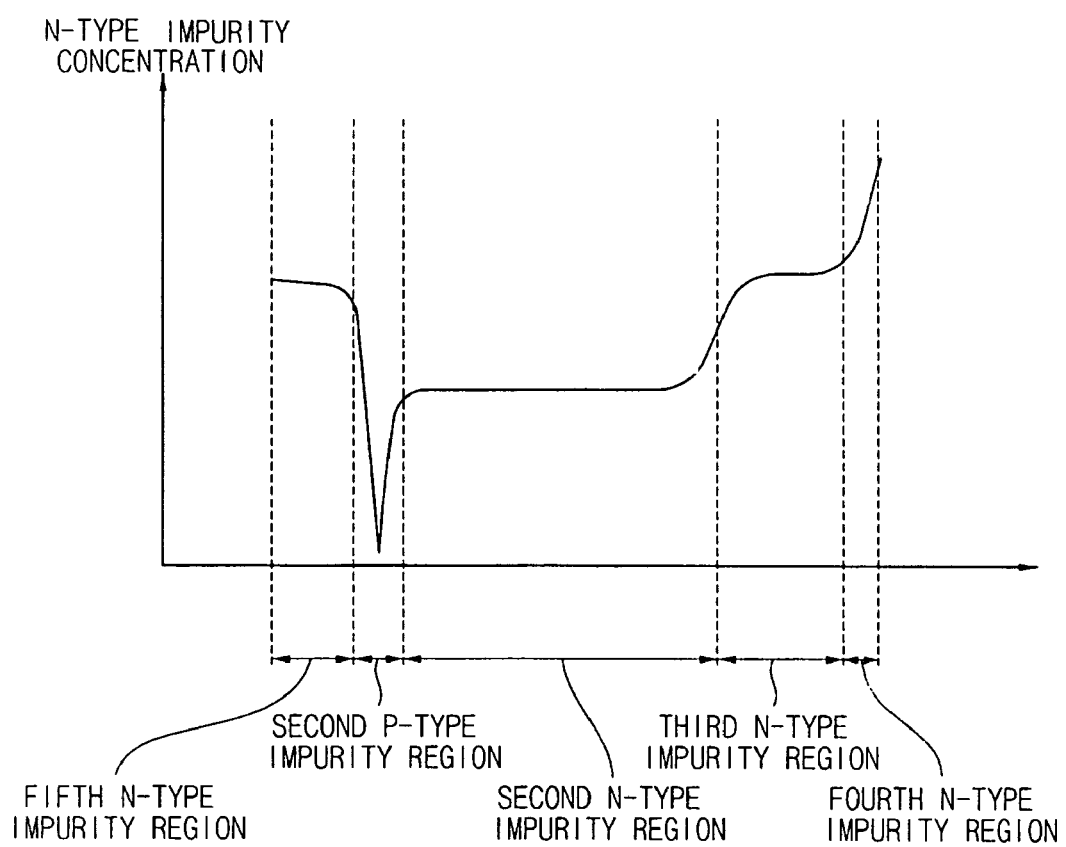
FIG. 12 is a graph of a concentration of N-type dopants measured under a gate insulator and an insulating structure in the semiconductor transistor device in FIG. 4 or 11, according to an embodiment of the present invention.

FIG. 12 is a graph of a concentration of a respective N-type dopant measured laterally from the N-type doped source region 115 to the additional N-type drift portion 111 in FIG. 11. Referring to FIG. 12, the respective N-type dopant concentration of the N-type doped source region 115 starts relatively high (labeled as FIFTH N-TYPE IMPURITY REGION in FIG. 12). Then, the respective N-type dopant concentration in the second P-type doped region 114 drops (labeled as SECOND P-TYPE IMPURITY REGION in FIG. 12).

Further referring to FIG. 12, the respective N-type dopant concentration in the first lateral portion 107 under the gate insulator 112 and under a left portion of the field oxide structure 110 is increased (labeled as SECOND N-TYPE IMPURITY REGION in FIG. 12) to the first dopant concentration. In addition, the respective N-type dopant concentration in the second lateral portion 108 under a right portion of the field oxide structure 110 is further increased (labeled as THIRD N-TYPE IMPURITY REGION in FIG. 12) to the second dopant concentration that is at least two times greater than the first dopant concentration of the first lateral portion 107.

Furthermore, the respective N-type dopant concentration in the additional N-type drift portion 111 under a further right portion of the field oxide structure 110 is further increased (labeled as FOURTH N-TYPE IMPURITY REGION in FIG. 12) to at least two time greater than the second dopant concentration of the second lateral portion 107. In an embodiment of the present invention, the respective N-type dopant concentration through the additional N-type drift portion 111 increases from adjacent the second lateral portion 108 to adjacent the P-type doped drain region 117.

Figure 3:
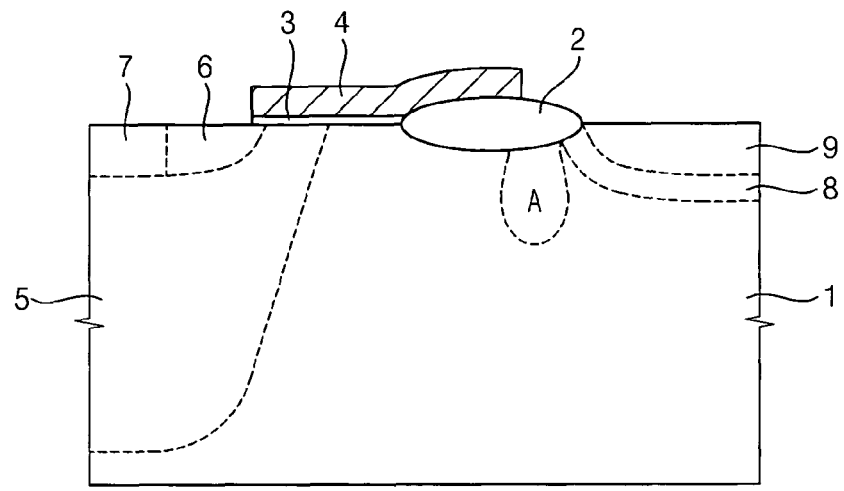
FIG. 3 shows the cross-sectional view of FIG. 1 with a region having a high concentration of holes formed under the field oxide structure according to the prior art.
Figure 13:
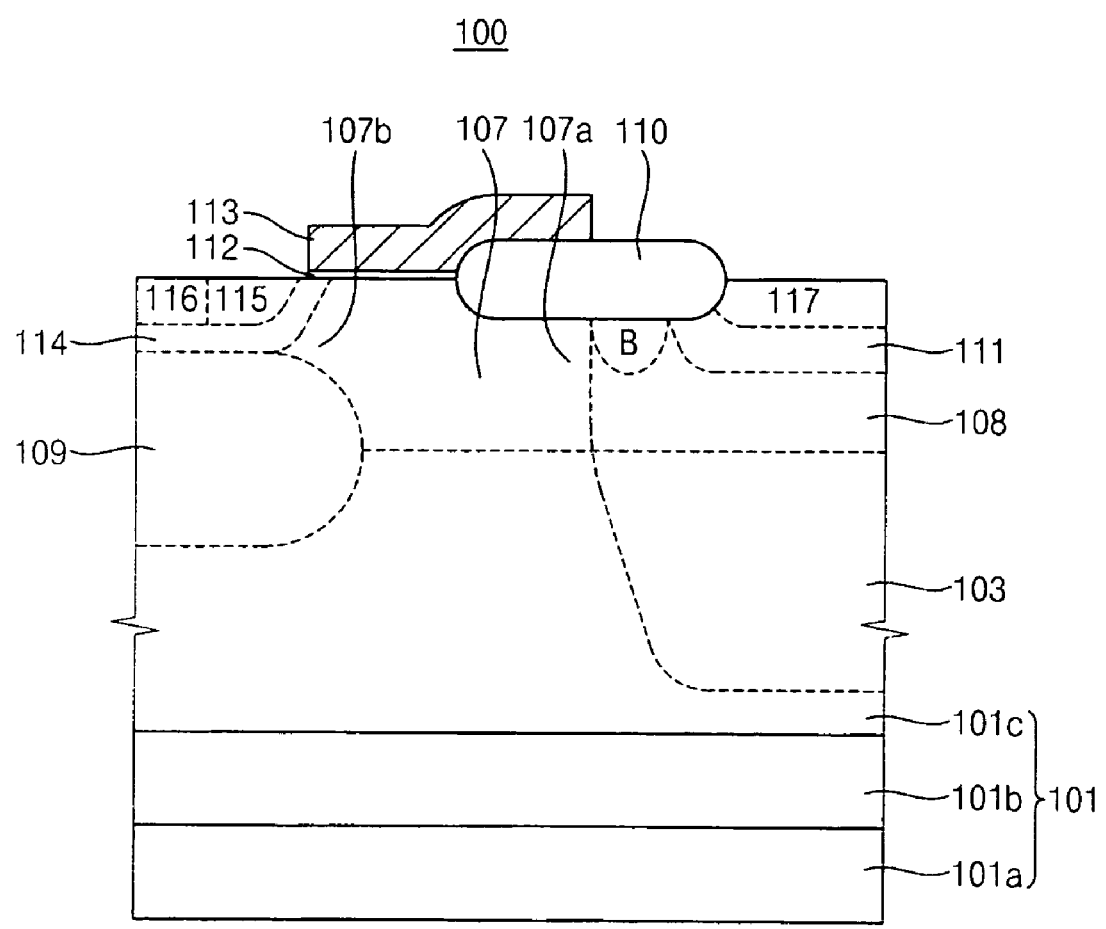
FIG. 13 shows a cross-sectional view of the semiconductor transistor device in FIG. 4 or 11 with a region having a reduced concentration of holes formed under the insulating structure according to an embodiment of the present invention.

With such an increase of the respective N-type dopant concentrations laterally through the regions 107, 108, and 111, the amount of holes generated at a region labeled "B" in FIG. 13 disposed under the field oxide structure 110 in the second lateral portion 108 is decreased from the region labeled "A" in FIG. 3 of the prior art when operating voltages are applied between the source and the drain and between the gate electrode 113 and the source of the semiconductor transistor device 100. Such a decrease of holes at the region "B" in FIG. 13 is verified by simulation of the semiconductor transistor device 100 with operating voltages applied between the source and the drain and between the gate electrode 113 and the source of the semiconductor transistor device 100.

Thus, parasitic current generated when holes move to the third P-type doped region 116 and then are removed from the third P-type doped region 116 may be advantageously decreased. Consequently, a break-down voltage of the semiconductor transistor device 100 may be increased for higher operating capacity of the semiconductor transistor device 100.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention.

Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A semiconductor transistor device comprising:
    a drift region including a first lateral portion having a first dopant concentration and a second lateral portion having a second dopant concentration that is higher than the first lateral portion;
    an insulating structure formed on the drift region and disposed over a border between the first and second lateral portions;
    a gate insulator formed on an exposed portion of the first lateral portion;
    a gate electrode formed on the gate insulator and a first surface of a portion of the insulating structure also having a second surface abutting the first portion of the drift region;
    a source disposed toward the first lateral portion of the drift region;
    a drain disposed toward the second lateral portion of the drift region; and
    an additional N-type drift portion of the drift region, formed in the second lateral portion toward the drain,
    wherein the insulating structure abuts the first and second lateral portions of the drift region, the additional N-type drift portion, and said drain of the transistor device.

2. The semiconductor transistor device of claim 1, wherein the insulating structure is a field oxide structure centered about a border between the first and second lateral portions.

3. The semiconductor transistor device of claim 1, wherein the second dopant concentration is at least two times greater than the first dopant concentration.

4. The semiconductor transistor device of claim 1, wherein the first and second dopant concentrations are each for a respective N-type dopant.

5. The semiconductor transistor device of claim 4, further comprising:
a P-type silicon layer disposed below the first lateral portion; and
a first P-type doped region disposed to a source side of the first lateral portion.

6. The semiconductor transistor device of claim 5, further comprising:
a second P-type doped region disposed above the first P-type doped region and disposed to the source side of the first lateral portion;
an N-type doped source region formed in the second P-type doped region to the source side of the gate electrode; and
a third P-type doped region formed in the second P-type doped region and to the side of the N-type doped source region,
wherein the N-type doped source region and the third P-type doped region form a source of the semiconductor transistor device.

7. The semiconductor transistor device of claim 6, wherein the gate insulator and the gate electrode extend to be disposed over the second P-type doped region and a portion of the N-type doped source region.

8. The semiconductor transistor device of claim 6, wherein the gate insulator and the gate electrode extend to be disposed over a portion of the second P-type doped region.

9. A semiconductor transistor device comprising:
a drift region including a first lateral portion having a first dopant concentration and a second lateral portion having a second dopant concentration that is higher than the first lateral portion;
an insulating structure formed on the drift region and disposed over a border between the first and second lateral portions;
a gate insulator formed on an exposed portion of the first lateral portion;
a gate electrode formed on the gate insulator and a portion of the insulating structure;
a source disposed toward the first lateral portion of the drift region;
a drain disposed toward the second lateral portion of the drift region;
an additional N-type drift portion of the drift region, formed in the second lateral portion toward the drain;
wherein the first and second dopant concentrations are each for a respective N-type dopant;
a P-type silicon layer disposed below the first lateral portion;
a first P-type doped region disposed to a source side of the first lateral portion;
a second P-type doped region disposed above the first P-type doped region and disposed to the source side of the first lateral portion;
an N-type doped source region formed in the second P-type doped region to the source side of the gate electrode;
a third P-type doped region formed in the second P-type doped region and to the side of the N-type doped source region,
wherein the N-type doped source region and the third P-type doped region form a source of the semiconductor transistor device;
a first N-type doped region disposed below the second lateral portion of the drift region,
wherein a respective dopant concentration of the first N-type doped region is less than the second dopant concentration of the second lateral portion.

10. The semiconductor transistor device of claim 9, further comprising:
a P-type doped drain region formed in the additional N-type drift portion,
wherein the P-type doped drain region forms a drain of the semiconductor transistor device.

11. The semiconductor transistor device of claim 10, wherein the additional N-type drift portion has a respective N-type dopant concentration that is greater than the second dopant concentration of the second lateral portion.

12. The semiconductor transistor device of claim 11, wherein the respective N-type dopant concentration of the additional N-type drift portion increases from adjacent the second lateral portion to adjacent to the P-type doped drain region.

13. The semiconductor transistor device of claim 10, further comprising:
an insulating layer disposed below the P-type silicon layer such that the semiconductor transistor device is an SOI (silicon on insulator) device.

14. The semiconductor transistor device of claim 13, wherein the insulating layer is disposed on a semiconductor substrate.

15. The semiconductor transistor device of claim 14, wherein the semiconductor transistor device is a Lateral Insulated Gate Bipolar Transition (LIGBT) Silicon On Insulator (SOI) device.

16. The semiconductor transistor device of claim 1, further comprising:
a P-type doped drain region formed in the additional N-type drift portion,
wherein the P-type doped drain region forms a drain of the semiconductor transistor device.

17. The semiconductor transistor device of claim 1, wherein the additional N-type drift portion has a respective N-type dopant concentration that is greater than the second dopant concentration of the second lateral portion.

18. The semiconductor transistor device of claim 17, wherein the respective N-type dopant concentration of the additional N-type drift portion increases from adjacent the second lateral portion to adjacent the P-type doped drain region.

19. The semiconductor transistor device of claim 1, further comprising:
a silicon layer having the drift region formed therein;
an insulating layer disposed below the silicon layer such that the semiconductor transistor device is an SOI (silicon on insulator) device; and
a semiconductor substrate disposed below the insulating layer.

20. The semiconductor transistor device of claim 19, wherein the semiconductor transistor device is a Lateral Insulated Gate Bipolar Transition (LIGBT) Silicon On Insulator (SOI) device.

* * * * *